US008258826B2

(12) United States Patent
Orino et al.

(10) Patent No.: US 8,258,826 B2
(45) Date of Patent: Sep. 4, 2012

(54) AUTOMATIC FREQUENCY CONTROL CIRCUIT

(75) Inventors: Hidenori Orino, Kanagawa (JP); Hiromi Saitou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 169 days.

(21) Appl. No.: 12/887,223

(22) Filed: Sep. 21, 2010

(65) Prior Publication Data

US 2011/0080195 A1  Apr. 7, 2011

(30) Foreign Application Priority Data

Oct. 5, 2009  (JP) ................. 2009-231537

(51) Int. Cl.
*H03B 19/00* (2006.01)
(52) U.S. Cl. ...................... 327/113; 327/164
(58) Field of Classification Search .................. 327/155, 327/113, 114, 165, 166
See application file for complete search history.

(56) References Cited

U.S. PATENT DOCUMENTS

| 5,900,751 | A | * | 5/1999 | Kuwabara | ............. 327/113 |
| 5,914,985 | A | | 6/1999 | Ishizu | |
| 7,352,831 | B2 | | 4/2008 | Quinlan et al. | |
| 7,705,639 | B1 | * | 4/2010 | Pirooz | ............. 327/113 |

FOREIGN PATENT DOCUMENTS

| JP | 8-139711 A | 5/1996 |
| JP | 9-83594 A | 3/1997 |

* cited by examiner

*Primary Examiner* — Hai L Nguyen
(74) *Attorney, Agent, or Firm* — Foley & Lardner LLP

(57) ABSTRACT

The present invention realizes low power consumption at the time of an automatic frequency control circuit operation. An automatic frequency control circuit includes a mixing unit that generates a modulated signal from a reception signal according to a frequency of a local signal, a demodulation unit that demodulates the modulated signal supplied by the mixing unit, an error evaluation unit that generates a frequency error signal according to a duty of the demodulated signal supplied by the demodulation unit, a holding unit that holds a frequency setting of the local signal and updates the frequency setting according to the frequency error signal supplied by the error evaluation unit, and an oscillation unit that controls a frequency of the local signal according to the frequency setting supplied by the holding unit.

3 Claims, 6 Drawing Sheets

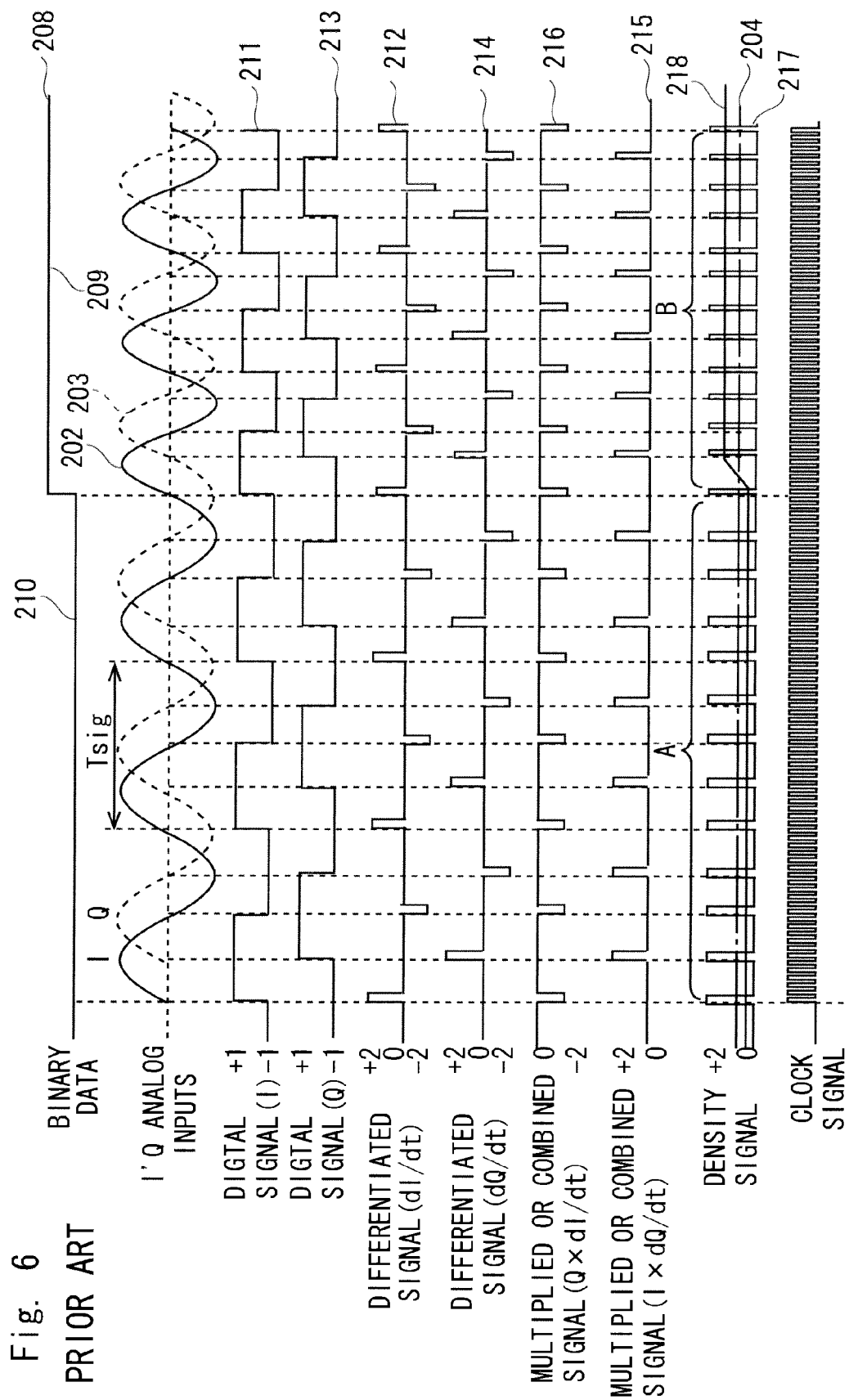

US 8,258,826 B2

AUTOMATIC FREQUENCY CONTROL CIRCUIT

INCORPORATION BY REFERENCE

This application is based upon and claims the benefit of priority from Japanese patent application No. 2009-231537, filed on Oct. 5, 2009, the disclosure of which is incorporated herein in its entirety by reference.

BACKGROUND

1. Field of the Invention

The present invention relates to an AFC (Automatic Frequency Control) circuit. In particular, the present invention relates to an AFC circuit used for a transceiver of FSK (Frequency Shift Keying) modulation that starts up the power only at the time of data transmitting and receiving, and requires intermittent operation of frequency synchronization.

2. Description of Related Art

In the field of wireless communications that perform intermittent operation (operates only at the time of data transmitting and receiving), reduction of power consumption of the transceiver is proceeding. In order to achieve low power consumption, it is required to reduce the power consumption at the time of the transceiver operation. Generally, an AFC circuit adjusts a frequency error using a pilot signal which is added to data in the wireless communications. However, such AFC circuit adds the pilot signal to the data, and thus the processing time of transmission and reception of data in the transceiver increases. The AFC circuit is necessary in order to improve reliability of the wireless communications. The AFC circuit is expected to reduce power consumption at the time of operation and be capable of adjusting the frequency error by a short pilot signal.

Therefore, a technique capable of adjusting a frequency error by a short pilot signal is disclosed in U.S. Pat. No. 7,352,831. FIG. 4 is a block diagram of an AFC circuit disclosed in U.S. Pat. No. 7,352,831.

An AFC circuit 300 includes a quadrature receiver 310, a demodulator 320, a digital frequency measurement system 330, and a loop 340. The quadrature receiver 310 performs frequency conversion using multipliers 311 and 312 to an IF (Intermediate Frequency) frequency which represents a difference between a frequency of an FSK modulated input signal Vin 201 and a PLL (Phase Locked Loop) 343, so as to generate FSK modulated analog quadrature input signals I202 and Q203.

The digital frequency measurement system 330 generates a digital output signal 204, which represents a center frequency of the analog quadrature input signal I202 and the analog quadrature input signal Q203.

The loop 340 uses a combining circuit 341 and an adjustment circuit 342 to calculate a frequency error signal Ferr 206 which represents a frequency error between the IF frequency converted as mentioned above and a target IF frequency 205. The loop 340 feeds back the frequency error signal Ferr 206 to the PLL 343, and adjusts an oscillation frequency of the PLL 343. Further, the loop 340 adjusts a difference between the frequency of input signal Vin 201 and the oscillation frequency of the PLL 343 to be the target IF frequency 205, which is output to the demodulator 320, and outputs an output signal 207 with no frequency error.

Hereinafter, the digital frequency measurement system 330 is explained with reference to FIGS. 5 and 6.

The center frequency of the analog quadrature input signals I202 and Q203 is usually an IF frequency. The IF frequency is a frequency greater than or equal to 0 Hz. As for the frequency of the analog quadrature input signals I202 and Q203, the IF frequency plus the frequency deviation (Fdev) indicates a data value "1" (the part indicated by the numeral 209) of binary data 208, and the IF frequency minus the frequency deviation (Fdev) indicates a data value "0" (the part indicated by the numeral 210) of the binary data 208.

The digital frequency measurement system 330 extracts the center frequency (IF frequency) of the analog quadrature input signals I202 and Q203 indicating the binary data 208.

An input signal to a differentiator 331 is a digital signal I211 with a value of ±1. An output signal by the differentiator 331 is a differentiated signal 212 with a value of ±2. An input signal to a differentiator 332 is digital signal Q213 with a value of ±1. An output signal by the differentiator 332 is a differentiated signal 214 with a value of ±2.

A signal processing circuit (multiplier) 333 multiplies the digital signal I211 by the differentiated signal 214, and outputs a multiplied signal 215. A signal processing circuit (multiplier) 334 multiplies the digital signal Q213 by the differentiated signal 212, and outputs a multiplied signal 216.

A subtractor 335 subtracts the multiplied signal 216 from the multiplied signal 215, and outputs a density signal 217. The density signal 217 has a pulse density which is proportional to the frequency of the analog quadrature input signals I202 and Q203. For example, the pulse density of the period indicated by the curly bracket B is greater than that of the period indicated by the curly bracket A. This is because that the data value of the binary data 208 is "1" in the period indicated by the curly bracket B. The digital filter 336 of FIG. 5 outputs an output signal Volpf 218. The output Volpf 218 represents an average value of the pulse density of the density signal 217. If the data value of the binary data 208 changes from "0" to "1", the frequency increases, and the average value of the pulse density of the output signal Volpf 218 also increases.

An envelope detector 337 calculates a midpoint of a maximum value Voh and a minimum value Vol of the output signal Volpf 218, and outputs a digital signal Voed (digital output signal) 204. The digital output signal 204 represents the center frequency of the analog quadrature input signals I202 and Q203 which are equivalent to the binary data 208. The digital output signal 204 can be calculated by two symbols "0" and "1" of the data values of the binary data 208.

Next, the loop 340 is explained with reference to FIG. 4.

The combining circuit 341 calculates a difference between the digital output signal 204, which is the center frequency of the analog quadrature input signals I202 and Q203, and the target IF frequency 205, and outputs a multiplied error signal 220.

The adjustment circuit 342 multiplies the multiplied error signal 220 by a scaling coefficient 221, and outputs the frequency error signal Ferr 206.

The AFC control system 344 filters the frequency error signal Ferr 206 and outputs an error signal 222 so as to provide stability to the loop 340.

An adder 345 adds the error signal 222 and fine frequency adjustment signal 223, and outputs a composite input signal 224.

The PLL 343 oscillates at a frequency, which is shifted by the composite input signal 224 including the frequency error from the frequency determined by a reference input signal 225 generated by the crystal oscillator 346 and an input N 226, and outputs an adjusted local oscillated signal 227.

A quadrature generator 347 generates a cosine quadrature signal 228 and a sine quadrature signal 229 from the adjusted local oscillator signal 227, and outputs the generated signals to the quadrature receiver 310.

Incidentally, Japanese Unexamined Patent Application Publication No. 8-139771 discloses an FSK receiver that uses an output signal demodulated by a demodulator to increase a gain to a gain variable amplifier. Further, Japanese Unexamined Patent Application Publication No. 9-83594 discloses an AFC circuit capable of operating independently from BTR (Bit Timing Recovery) by obtaining a frequency deviation Δω using a detection signal of an oversampling cycle, which is supplied by a reception filter. However, techniques disclosed in Japanese Unexamined Patent Application Publication Nos. 8-139771 and 9-83594 are not purposed to reduce power at the time of AFC circuit operation.

SUMMARY

The present inventors have found a problem that in the AFC circuit disclosed in U.S. Pat. No. 7,352,831, the operational speed of the circuit of the digital frequency measurement system 330 for calculating the frequency error must be increased, and thereby increasing the power consumption.

The reason is that the digital frequency measurement system 330 oversamples the analog input signals I202 and Q203, which are supplied to the digital frequency measurement system 330 and the demodulator 320 of FIG. 4. Therefore, the power consumption of the digital frequency measurement system 330 increases.

The increase in the power consumption of the digital frequency measurement system 330 is especially pronounced in the case that the IF frequency of the analog input signals I202 and Q203 is other than 0 Hz.

A clock Fclk is defined by the equation 1. The relationship between a modulation index m, frequency of a data rate Drate, and a frequency deviation Fdev is represented by the equation 2. Note that IF is the target IF frequency, Fdev is the frequency deviation, and Ferr is the frequency error signal.

$$Fclk = 8(IF + Fdev + Ferr) \qquad \text{<Equation 1>}$$

$$m = 2 \times Fdev/Drate \qquad \text{<Equation 2>}$$

Generally, IF is a value greater than or equal to 0 Hz (may be a value of 100 MHz or 200 MHz depending on the system). Fdev takes a value between 100 Hz and 5 MHz. For example, if m=1 and Drate=20 kHz, Fdev will be 10 kHz. If IF=200 kHz and Ferr=5 kHz, Fclk will be 1720 kHz from the equations 1 and 2. The digital frequency measurement system 330 calculates the frequency error using the input signals supplied to the demodulator 320. Therefore, the operational speed becomes higher and the power consumption increases compared with the target IF frequency of 200 kHz.

An exemplary aspect of the present invention is an automatic frequency control circuit which includes a mixing unit that generates a modulated signal from a reception signal according to a frequency of a local signal, a demodulation unit that demodulates the modulated signal supplied by the mixing unit, an error evaluation unit that generates a frequency error signal according to a duty of the demodulated signal supplied by the demodulation unit, a holding unit that holds a frequency setting of the local signal and updates the frequency setting according to the frequency error signal supplied by the error evaluation unit, and an oscillation unit that controls a frequency of the local signal according to the frequency setting supplied by the holding unit. In this way, the automatic frequency control circuit calculates the frequency error using the demodulated signal of the demodulation unit with a comparatively low frequency. Thus the operational speed of the error evaluation unit that calculates the frequency error can be lower, and thereby reducing the power consumption. Accordingly it is possible to achieve low power at the time of the automatic frequency control circuit operation.

The present invention achieves to reduce the power at the time of AFC circuit operation.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 6 illustrates waveforms of a digital frequency measurement system in the AFC circuit according to the prior art.

DETAILED DESCRIPTION OF THE EXEMPLARY EMBODIMENTS

Figure 1:
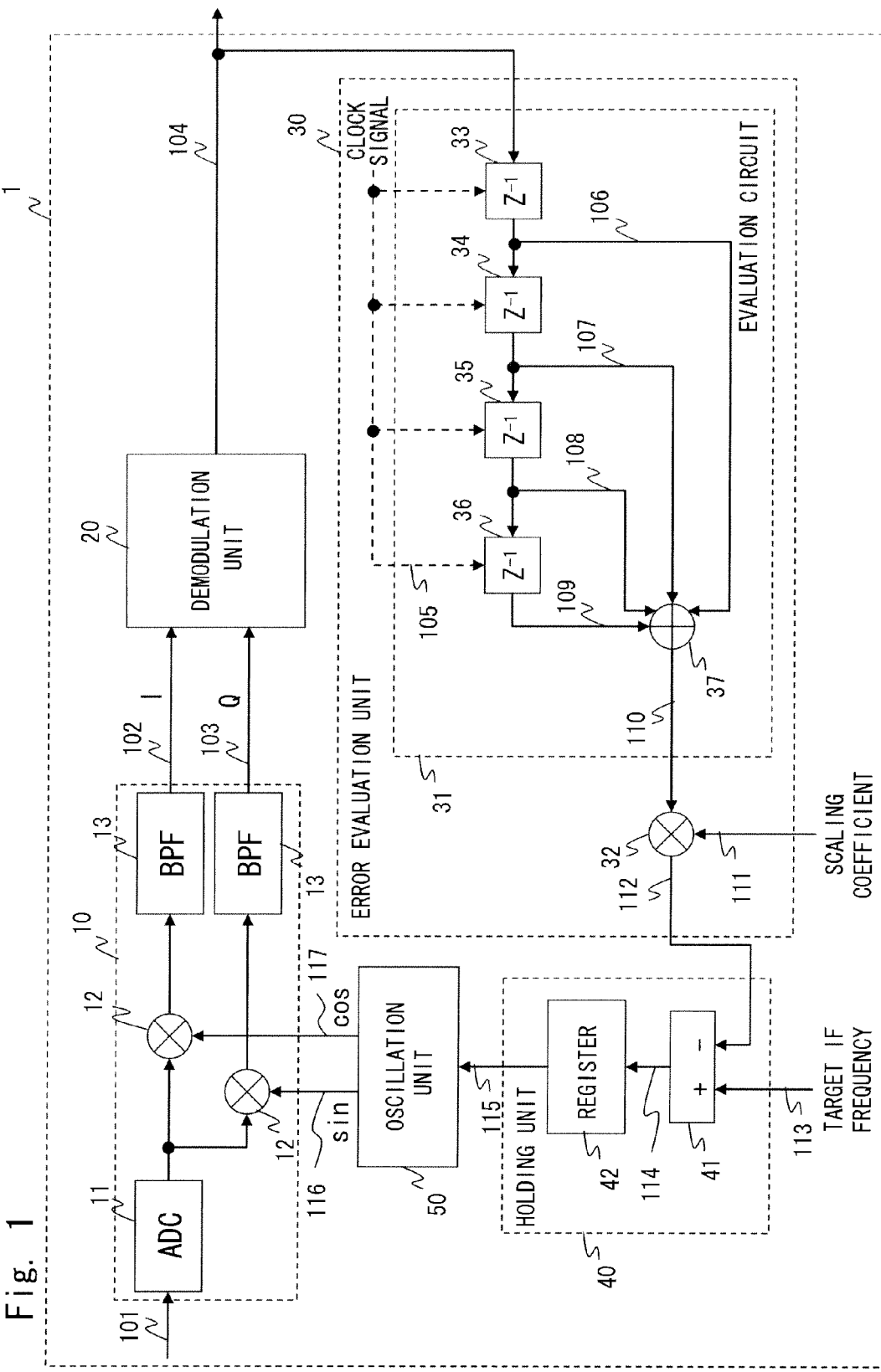
FIG. 1 is a block diagram illustrating an AFC circuit according to an exemplary embodiment of the present invention.

An exemplary embodiment of an automatic frequency control circuit according to the present invention is described hereinafter. However, the present invention is not necessarily limited to the following embodiment. For the clarity of the explanation, the following descriptions and drawings are simplified as appropriate.

An AFC circuit 1 includes a mixing unit 10, a demodulation unit 20, an error evaluation unit 30, a holding unit 40, and an oscillation unit 50.

The mixing unit 10 generates a modulated signal from a reception signal according to a frequency of an output signal (local signal) supplied by the oscillation unit 50. Specifically, the mixing unit 10 includes an analog-to-digital converter (ADC) 11, a multiplier 12, and a band pass filter (BPF) 13. The ADC 11 receives an FSK modulated analog input signal 101, converts the analog input signal 101 into a digital signal, and outputs the digital signal to the multiplier 12.

The multiplier receives the output signal from the ADC 11 and the output signal from the oscillation unit 50. The multiplier 12 outputs a multiplied signal to the band pass filter 13. The band pass filter 13 has characteristics of passing frequencies of the target IF frequency and its neighborhood frequencies. Accordingly, the band pass filter 13 removes unnecessary signals other than the target IF frequency and its neighborhood frequencies, and outputs the signal to the demodulation unit 20.

The demodulation unit 20 demodulates a signal of the FSK demodulation method in which the phase continuously changes, such as CPFSK (Continuous Phase Frequency Shift Keying), GFSK (Gaussian Frequency-Shift Keying) and GMSK (Gaussian filtered Minimum Shift Keying). The demodulation unit 20 receives the quadrature input signals I102 and Q103 from the mixing unit 10. The demodulation unit 20 demodulates the quadrature input signals I102 and Q103, and generates a demodulated signal 104. Then, the demodulation unit 20 outputs the demodulated signal 104 to the error evaluation unit 30.

The error evaluation unit 30 generates a frequency error signal according to duty of the demodulated signal 104 supplied by the demodulation unit 20. The error evaluation unit 30 includes an evaluation circuit 31 and an adjustment circuit 32. The evaluation circuit 31 includes delay circuits 33, 34, 35, and 36 and an adder 37. The delay circuits 33, 34, 35, and 36 are composed of flip-flops, for example. The delay circuits 33, 34, 35, and 36 delay the demodulated signal 104 according to an input clock 105, and outputs the delayed signals 106, 107, 108, and 109 to the adder 37. The adder 37 adds the output signals 106, 107, 108, and 109 from the delay circuits 33, 34, 35, and 36, generates a frequency error signal 110, and outputs the frequency error signal 110 to the adjustment circuit 32.

The adjustment circuit 32 is composed of a multiplier, for example. The adjustment circuit 32 receives the frequency error signal 110 supplied by the adder 37, and also receives a scaling coefficient 111. The adjustment circuit 32 normalizes the frequency error signal 112 according to the scaling coefficient 111, and outputs the normalized frequency error signal 112 to the holding unit 40.

The holding unit 40 holds the frequency setting of local signals 116 and 117 in the oscillation unit 50, and updates the frequency setting according to the normalized frequency error signal 112, which is supplied by the error evaluation unit 30. Accordingly, the holding unit 40 includes a subtractor 41 and a register 42. The subtractor 41 receives the normalized frequency error signal 112 and a target IF frequency 113. The subtractor 41 calculates a difference between the target IF frequency 113 and the normalized frequency error signal 112 to generate a corrected value 114, and outputs the corrected value 114 to the register 42. The register 42 updates the frequency setting of the local signals 116 and 117 in the oscillation unit 50 according to the corrected value 114 supplied by the subtractor 41, and holds the updated frequency setting. Then, the register 42 outputs a signal 115 indicating the frequency setting to the oscillation unit 50.

The oscillation unit 50 is complex Lo OSC (NCO: Numerical Control Oscillator), for example. The oscillation unit 50 is controlled by the signal 115 indicating the frequency setting, which is supplied by the register 42. To be specific, the oscillation unit 50 oscillates at a frequency proportional to the signal 115 indicating the frequency setting, and outputs the local signals 116 and 117 to the multiplier 12.

As described thus far, the AFC circuit 1 calculates the frequency error using the demodulation unit 20, the error evaluation unit 30, and the holding unit 40, feeds back the frequency error to the oscillation unit 50, and controls the oscillation unit 50 so that the IF frequency of the quadrature input signals I102 and Q103 becomes the target IF frequency.

The operations of the demodulation unit 20, the error evaluation unit 30, and the holding unit 40 are explained with reference to FIGS. 2 and 3. The modulated signals I and Q of FIGS. 2 and 3 are representations by frequencies of the quadrature input signals I102 and Q103 modulated at a linear frequency deviation.

Figure 2:
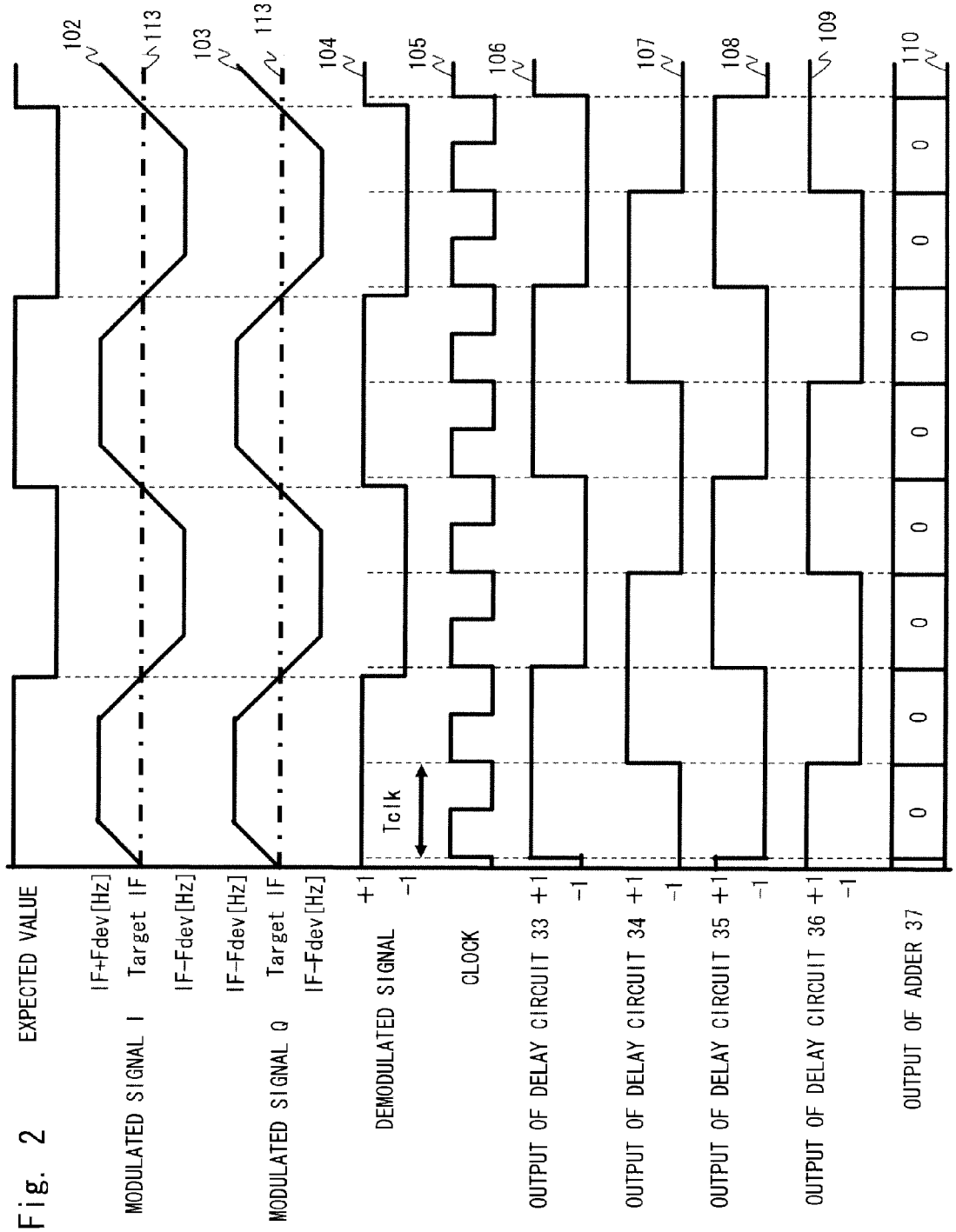
FIG. 2 illustrates waveforms in the AFC circuit according to the exemplary embodiment of the present invention when an IF frequency is not shifted.
Figure 3:
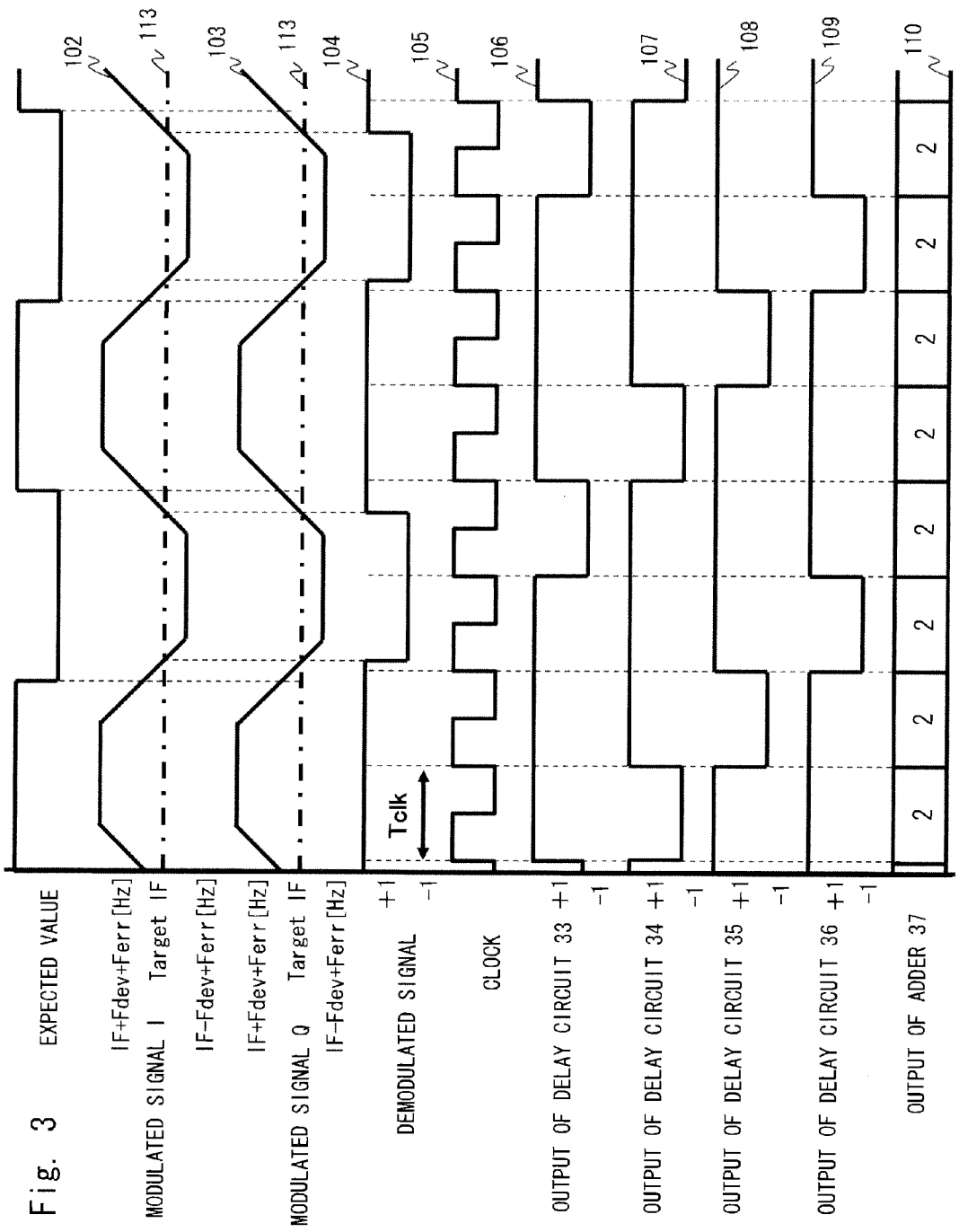
FIG. 3 illustrates the waveforms in the AFC circuit according to the exemplary embodiment of the present invention when the IF frequency is shifted.
Figure 4:
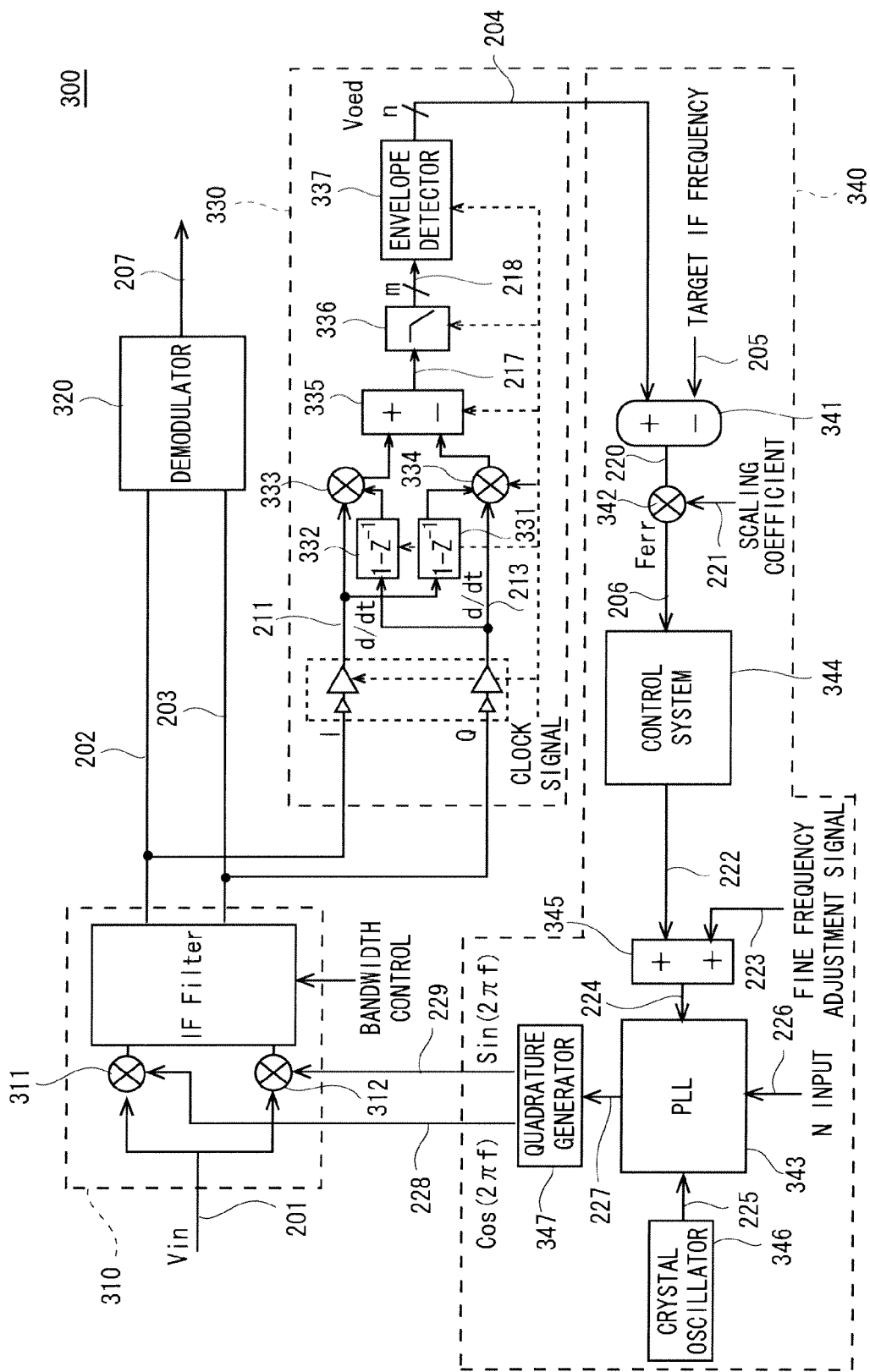
FIG. 4 is a block diagram illustrating an AFC circuit according to a prior art.
Figure 5:
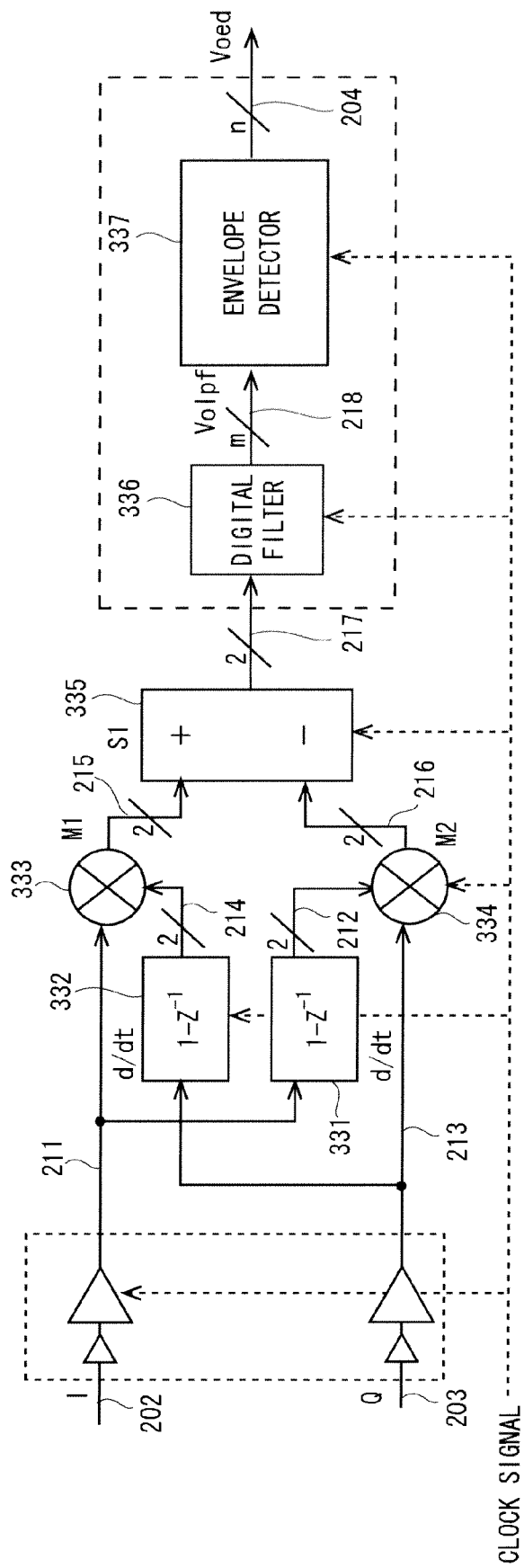
FIG. 5 is a block diagram illustrating a digital frequency measurement system in the AFC circuit according to the prior art.

First, a case of FIG. 2 is explained, in which the target IF frequency 113 and the IF frequency of the quadrature input signals I102 and Q103 are not shifted.

The demodulated signal 104 is a representation by E1 of the output signal from the demodulation unit 20. If the IF frequency of the quadrature input signals I102 and Q103 is higher than the target IF frequency 113, the demodulation unit 20 outputs +1 as the demodulated signal 104. On the other hand, if the IF frequency of the quadrature input signals I102 and Q103 is lower than the target IF frequency 113, the demodulation unit 20 outputs −1 as the demodulated signal 104. At this time, as the IF frequency of the quadrature input signals I102 and Q103 is equivalent to the target IF frequency 113, the demodulation unit 20 outputs a signal with 50% duty as the demodulated signal 104.

The delay circuit 33 synchronizes the demodulated signal 104 with the clock 105, and outputs it to the adder 37 as the output signal 106. The delay circuit 34 delays the output signal 106 supplied by the delay circuit 33 by one cycle time Tclk of the clock 105, and outputs it to the adder 37 as the output signal 107. The delay circuit 35 delays the output signal 107 supplied by the delay circuit 34 by one cycle time Tclk of the clock 105, and outputs it to the adder 37 as the output signal 108. The delay circuit 36 delays the output signal 108 supplied by the delay circuit 35 by one cycle time Tclk of the clock 105, and outputs it to the adder 37 as the output signal 109.

The adder 37 adds the output signals 106, 107, 108, and 109 to generate the frequency error signal 110, and outputs the frequency error signal 110 to the adjustment circuit 32. The frequency error signal 110 represents the frequency error. At this time, if there is no frequency error as described above, the demodulated signal 104 with 50% duty is supplied to the delay circuits 33, 34, 35, and 36. Thus the adder 37 outputs "0" as the frequency error signal 110.

Next, a case of FIG. 3 is explained, in which the target IF frequency 113 and the IF frequency of the quadrature input signals I102 and Q103 are shifted.

The demodulated signal 104 is a representation by ±1 of the output signal supplied by the demodulation unit 20 as with the abovementioned case with no frequency error. As the IF frequency of the quadrature input signals I102 and Q103 and the target IF frequency 113 are shifted, the demodulation unit 20 outputs a signal with duty not 50%.

The delay circuits 33, 34, 35, and 36 and the adder 37 perform the same operation as FIG. 2. At this time, if there is a frequency error, the demodulated signal 104 with duty not 50% is supplied to the delay circuits 33, 34, 35, and 36. Thus the adder 37 outputs a value "2" indicating the frequency error as the frequency error signal 110. Therefore, as the frequency error signal 110 can perform calculation if the expected value of FIG. 3 has two symbols of "0" and "1", the frequency error can be calculated even by a short pilot signal.

The adjustment circuit 32 multiplies the frequency error signal 110 by the scaling coefficient 111, and outputs the normalized frequency error signal 112.

Then, as mentioned above, the holding unit 40 calculates the difference between the normalized frequency error signal 112 and the target IF frequency 113, and feeds it back to the oscillation unit 50. The oscillation unit 50 oscillates at a frequency shifted by the difference between the normalized frequency error signal 112 and the target IF frequency 113. The IF frequency of the quadrature input signals I102 and Q103 becomes substantially equivalent to the target IF frequency.

In this way, the AFC circuit 1 of this exemplary embodiment calculates the frequency error using the demodulated signal 104 of the demodulation unit 20 with a comparatively low frequency. Therefore, the operational speed of the error evaluation unit 30 which calculates the frequency error can be made low, and it is possible to reduce the power consumption.

For example, as with the modulated signals of FIGS. 2 and 3, if the signal is modulated at a linear frequency deviation and the frequency error signal 110 is within the frequency deviation Fdev, the frequency Fclk of the clock 105 in FIG. 1 can be represented by the equation 3.

$$Fclk = Drate^2 / Ferr \qquad \text{<Equation 3>}$$

At this time, if Drate=10 kHz and Ferr is 5 kHz, Fclk will be 20 kHz. As described above, the demodulated signal 104, which is not related to the IF frequency, is oversampled to calculate the frequency error. Therefore, it is possible to suppress the power consumption to be low.

Moreover, the error evaluation unit 30 calculates the frequency error by the demodulated signal 104, which is not related to the IF frequency 112, using the phenomenon that the duty of the output by the demodulation unit 20 will not be 50% if there is a frequency error. Therefore, the frequency error can be calculated even if the operational speed of the error evaluation unit 30 is low.

Further, the error evaluation unit 30 is composed of the delay circuits 33, 34, 35, and 36, which can be composed of flip-flops, and the adder 37, which can be composed of a circuit with a bit width corresponding to the number of the delay circuits. That is, as the error evaluation unit 30 is not composed of a digital filter and a envelope detector that cause to increase the circuit size, it is possible to reduce the circuit size.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An automatic frequency control circuit comprising:
    a mixing unit that generates a modulated signal from a reception signal according to a frequency of a local signal;
    a demodulation unit that demodulates the modulated signal supplied by the mixing unit;
    an error evaluation unit that generates a frequency error signal according to a duty of the demodulated signal supplied by the demodulation unit;
    a holding unit that holds a frequency setting of the local signal and updates the frequency setting according to the frequency error signal supplied by the error evaluation unit; and
    an oscillation unit that controls a frequency of the local signal according to the frequency setting supplied by the holding unit.

2. The automatic frequency control circuit according to claim 1, wherein
    the error evaluation unit comprises an evaluation circuit and an adjustment circuit,
    the evaluation circuit comprises a plurality of delay circuits that delay the demodulated signal according to an input clock, and an adder that adds the delayed signal supplied by the plurality of delay circuits and generates the frequency error signal, and
    the adjustment circuit generates a normalized frequency error signal from the frequency error signal according to a scaling coefficient.

3. The automatic frequency control circuit according to claim 1, wherein
    the holding unit comprises a subtractor and a register,
    the subtractor calculates a difference between a target IF frequency and the normalized frequency error signal to generate a corrected value, and
    the register updates the frequency setting of the oscillator according to the corrected value.

* * * * *